United States Patent
Kobayashi et al.

(10) Patent No.: US 9,112,135 B2
(45) Date of Patent: Aug. 18, 2015

(54) PIEZOELECTRIC ELEMENT AND METHOD FOR MANUFACTURING PIEZOELECTRIC ELEMENT

(75) Inventors: Nobuo Kobayashi, Tokyo (JP); Noriaki Hirano, Tokyo (JP); Masaru Nanao, Tokyo (JP); Masahiro Kitajima, Tokyo (JP); Mitsunao Homma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 239 days.

(21) Appl. No.: 13/538,432

(22) Filed: Jun. 29, 2012

(65) Prior Publication Data

US 2013/0009520 A1   Jan. 10, 2013

(30) Foreign Application Priority Data

Jul. 8, 2011   (JP) .................. 2011-152107

(51) Int. Cl.
- *H01L 41/22* (2013.01)
- *H01L 41/053* (2006.01)
- *G11B 5/48* (2006.01)
- *H01L 41/09* (2006.01)
- *H01L 41/23* (2013.01)
- *H01L 41/338* (2013.01)

(52) U.S. Cl.
CPC ............ *H01L 41/053* (2013.01); *G11B 5/4873* (2013.01); *H01L 41/0533* (2013.01); *H01L 41/0986* (2013.01); *H01L 41/23* (2013.01); *H01L 41/338* (2013.01); *Y10T 29/42* (2015.01)

(58) Field of Classification Search
CPC ..... H01L 41/047; H01L 41/083; H01L 41/09; H01L 41/0926; H03H 9/132
USPC .............. 310/328, 365, 363, 364, 366
See application file for complete search history.

(56) References Cited

U.S. PATENT DOCUMENTS

| | | | | |
|---|---|---|---|---|
| 6,570,299 | B2 * | 5/2003 | Takeshima et al. | 310/348 |
| 6,661,618 | B2 * | 12/2003 | Fujiwara et al. | 360/294.4 |
| 2002/0053860 | A1 * | 5/2002 | Mitarai et al. | 310/366 |
| 2003/0107301 | A1 * | 6/2003 | Asano et al. | 310/328 |
| 2004/0255443 | A1 * | 12/2004 | Iwase et al. | 29/25.35 |
| 2010/0208390 | A1 * | 8/2010 | Hanya et al. | 360/245.2 |
| 2010/0302687 | A1 * | 12/2010 | Soga et al. | 360/294.4 |
| 2010/0327699 | A1 | 12/2010 | Hassanali et al. | |
| 2011/0051290 | A1 * | 3/2011 | Inoue et al. | 360/244.2 |

FOREIGN PATENT DOCUMENTS

| | | |
|---|---|---|
| JP | A-2010-192010 | 9/2010 |
| JP | 2011-514608 A | 5/2011 |

* cited by examiner

*Primary Examiner* — Derek Rosenau
*Assistant Examiner* — Bryan Gordon
(74) *Attorney, Agent, or Firm* — Oliff PLC

(57) ABSTRACT

A piezoelectric element is provided with an element body, which has a pair of principal faces opposed to each other and an end face extending in a direction in which the pair of principal faces are opposed to each other, so as to connect the pair of principal faces, and which is comprised of a piezoelectric ceramic material; a pair of electrodes arranged respectively on the pair of principal faces; and a resin covering an entire area of the end face and arranged so as to make contact with the pair of electrodes. The resin has two edges in the aforementioned direction projecting outward in the aforementioned direction from the respective electrodes.

6 Claims, 7 Drawing Sheets

(a)

(b)

(c)

PIEZOELECTRIC ELEMENT AND METHOD FOR MANUFACTURING PIEZOELECTRIC ELEMENT

BACKGROUND OF THE INVENTION

1. Field of the Invention

The present invention relates to a piezoelectric element and a method for manufacturing the piezoelectric element.

2. Related Background Art

A known piezoelectric element is one provided with an element body, which has a pair of principal faces opposed to each other and end faces extending in a direction in which the pair of principal faces are opposed to each other, so as to connect the pair of principal faces, and which is comprised of a piezoelectric ceramic material, and with a pair of electrodes arranged respectively on the pair of principal faces (e.g., cf. Japanese Patent Application Laid-open No. 2010-192010).

SUMMARY OF THE INVENTION

The piezoelectric element described in the Laid-open No. 2010-192010 has the problems as described below.

Since the element body is comprised of the piezoelectric ceramic material, crystal grains thereof can drop off from the end faces of the element body. When the piezoelectric element is used in a head suspension for disk device as described in the Laid-open No. 2010-192010, the dropping crystal grains can enter a space between a disk and a slider forming a magnetic head. The crystal grains entering the space between the disk and the slider forming the magnetic head can cause damage to the disk and the slider.

Furthermore, delamination can occur easily between the element body and the electrodes. The element body is comprised of the piezoelectric ceramic material and the electrodes are comprised of a metal material. Since the element body and the electrodes are made of the different materials, the occurrence of delamination is unavoidable at interfaces between the element body and the electrodes.

An object of the present invention is to provide a piezoelectric element capable of preventing the crystal grains from dropping off from the end faces of the element body and preventing the occurrence of delamination between the element body and the electrodes, and a method for manufacturing the piezoelectric element.

A piezoelectric element according to the present invention is a piezoelectric element comprising: an element body which has a pair of principal faces opposed to each other, and an end face extending in a direction in which the pair of principal faces are opposed to each other (which will be referred to hereinafter as "opposed direction"), so as to connect the pair of principal faces, and which is comprised of a piezoelectric ceramic material; a pair of electrodes arranged respectively on the pair of principal faces; and a resin covering an entire area of the end face and arranged so as to make contact with the pair of electrodes, wherein the resin has two edges in the opposed direction projecting outward in the opposed direction from the respective electrodes.

In the present invention, the entire area of the end face of the element body is covered by the resin. For this reason, crystal grains are prevented from dropping off from the end face of the element body. In the present invention, the pair of electrodes are in contact with the resin. For this reason, the electrodes are prevented from delaminating from the element body.

In the present invention, the two edges of the resin covering the entire area of the end face of the element body are arranged to project outward in the opposed direction from the respective electrodes. For this reason, when the piezoelectric element is fixed to another member with an adhesive, the piezoelectric element is arranged so that either one of the principal faces (electrodes) is located on the other member side. At this time, since the two edges of the resin are arranged to project as described above, there is a relatively large gap formed between a surface of the electrode and the other member. This gap can be used as an adhesive pool, whereby the adhesion strength is improved between the piezoelectric element and the other member.

At least one of the two edges of the resin may cover a region near the end face in a surface of the electrode, along an edge of the electrode. In this case, the contact area between the electrode and the resin is increased, whereby the electrode is prevented more securely from delaminating from the element body.

The end face of the element body and respective end faces of the pair of electrodes may be aligned in position as cut faces. In this case, it becomes easier to achieve contact between the electrodes and the resin.

A manufacturing method of a piezoelectric element according to the present invention is a method for manufacturing a piezoelectric element, comprising: a preparation step of preparing a piezoelectric element substrate having a pair of principal faces opposed to each other and having electrodes formed on the pair of principal faces; an attachment step of attaching a tape with adhesion to one of the principal faces of the piezoelectric element substrate; a substrate cutting step of cutting the piezoelectric element substrate from the other principal face side of the principal faces of the piezoelectric element substrate and removing a portion of the tape; a resin filling step of filling a channel formed by the cutting step, with a resin so that the resin is in contact with each of the electrodes and is arranged to project outward in the opposed direction from the electrode formed on the other principal face; a resin cutting step of cutting the resin from the other principal face side; and a peeling step of peeling the tape off from the piezoelectric element substrate.

In the manufacturing method of the piezoelectric element according to the present invention, the substrate cutting step is to remove a portion of the tape, the resin filling step is to fill the channel with the resin so as to bring the resin in contact with each of the electrodes and so as to project the resin outward in the opposed direction from the electrode formed on the other principal face, and the resin cutting step is to cut the resin. Through this process, the entire area of the cut face of the piezoelectric element substrate is covered by the resin. For this reason, crystal grains are prevented from dropping off from the cut face of the piezoelectric element substrate. Since the resin is in contact with the pair of electrodes, the electrodes are prevented from delaminating from the piezoelectric element substrate.

Since a portion of the tape is removed, the resin comes to project outward in the opposed direction, not only from the electrode formed on the other principal face, but also from the electrode formed on the one principal face. For this reason, as described above, the adhesion strength is improved between the manufactured piezoelectric element and the other member.

The resin filling step may comprise filling the resin so as to cover a region near a cut face in a surface of the electrode formed on the other principal face, along an edge of the electrode. In this case, the contact area increases between the electrode formed on the other principal face and the resin, whereby the electrode is prevented more securely from delaminating from the element body.

The substrate cutting step may comprise removing a portion of the tape so as to form a space between a region near a cut face in a surface of the electrode formed on the one principal face, and the tape, and the resin filling step may comprise filling the space thus formed, with the resin. In this case, the contact area increases between the electrode formed on the one principal face and the resin, whereby the electrode is prevented more securely from delaminating from the element body.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference signs, without redundant description.

Figure 1:
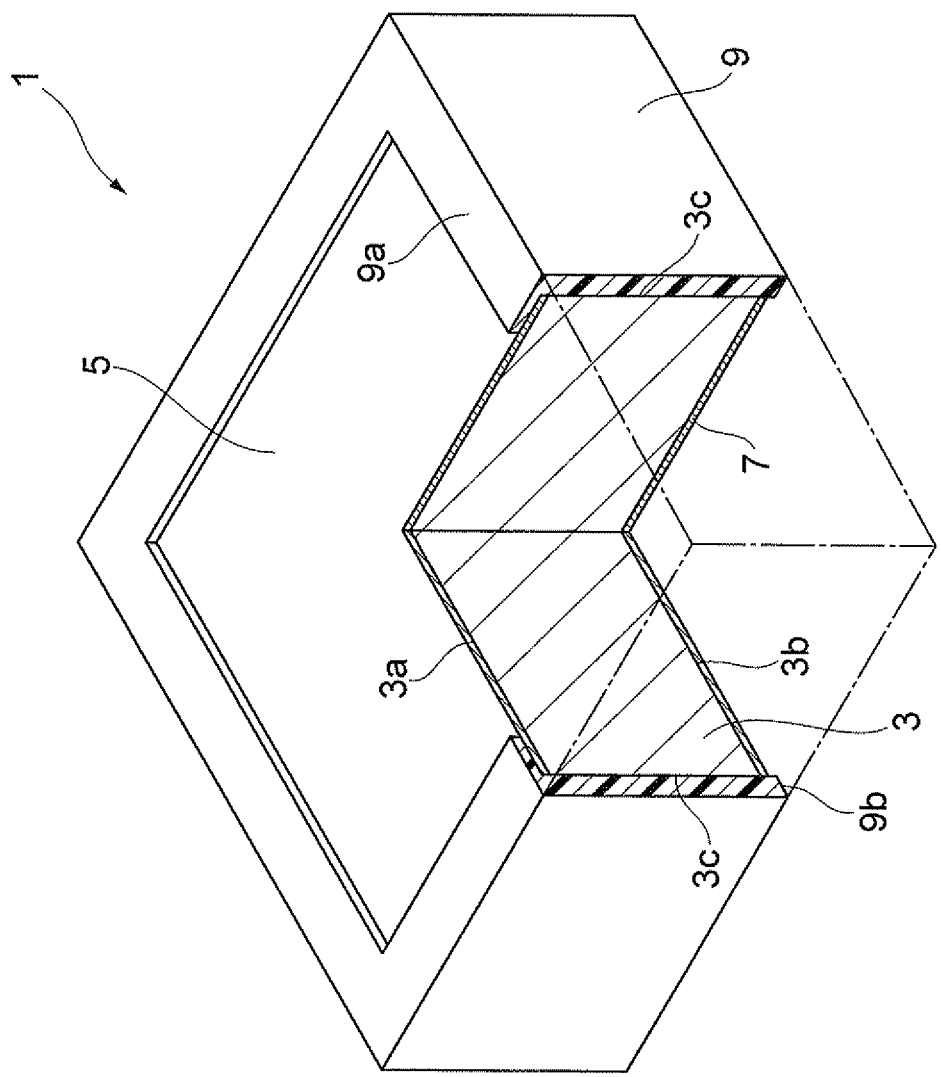
FIG. 1 is a perspective view showing a piezoelectric element according to an embodiment of the present invention.
Figure 2:
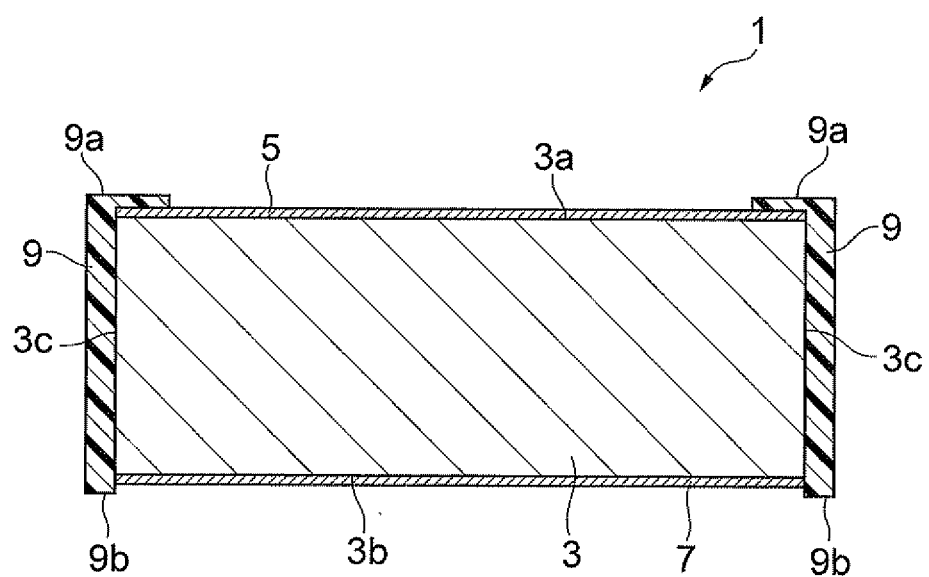
FIG. 2 is a drawing explaining a cross-sectional configuration of the piezoelectric element according to the embodiment.

First, a configuration of a piezoelectric element 1 according to an embodiment of the present invention will be described with reference to FIGS. 1 and 2. FIG. 1 is a perspective view showing the piezoelectric element according to the present embodiment. FIG. 2 is a drawing explaining a cross-sectional configuration of the piezoelectric element according to the present embodiment.

The piezoelectric element 1, as shown in FIG. 1, is provided with an element body 3, a pair of first electrode 5 and second electrode 7, and a resin 9. The piezoelectric element 1 is applied, for example, to a disk device with a magnetic disk. Namely, the piezoelectric element 1 is used as a second actuator except for a voice coil motor in the disk device of a dual actuator system.

The element body 3 has a pair of first principal face 3a and second principal face 3b, and end faces 3c. The first principal face 3a and the second principal face 3b are opposed to each other. The end faces 3c extend in a direction in which the first principal face 3a and the second principal face 3b are opposed to each other (which will sometimes be referred to hereinafter simply as "opposed direction"), so as to connect the first principal face 3a and the second principal face 3b. The element body 3 has a rectangular parallelepiped shape. Therefore, the element body 3 has a rectangular shape on a plan view and thus has four end faces 3c. The element body 3 is comprised of a piezoelectric ceramic material. Examples of piezoelectric ceramic materials applicable herein include PZT [Pb(Zr,Ti)O$_3$], PT(PbTiO$_3$), PLZT[(Pb,La)(Zr,Ti)O$_3$], barium titanate (BaTiO$_3$), and so on.

The first electrode 5 is arranged on the first principal face 3a so as to cover the entire area of the first principal face 3a. The second electrode 7 is arranged on the second principal face 3b so as to cover the entire area of the second principal face 3b. The end faces 3c are not covered by the electrodes. The first electrode 5 and the second electrode 7 are comprised of a metal material such as Au. The first electrode 5 and the second electrode 7 can be formed, for example, by sputtering, evaporation, or the like.

The resin 9 covers the entire area of the end faces 3c. The resin 9 is arranged on the end faces 3c so as to make contact with the first electrode 5 and the second electrode 7. An epoxy resin is used as a material of the resin 9. Besides the epoxy resin, a thermosetting resin such as urethane resin can be employed. It is also possible to use an ultraviolet curable resin such as epoxy acrylate resin or urethane acrylate resin. It is also possible to use a hot-melt resin such as polyvinyl acetate.

The resin 9 has two edges 9a, 9b in the opposed direction projecting outward in the opposed direction from the respective electrodes 5, 7. Namely, the two edges 9a, 9b of resin 9 are arranged to project away from the respective electrodes 5, 7 in the opposed direction. The edge 9a of resin 9 covers a region near the end faces 3c in the surface of the first electrode 5, along the edge of the first electrode 5.

Figure 3:
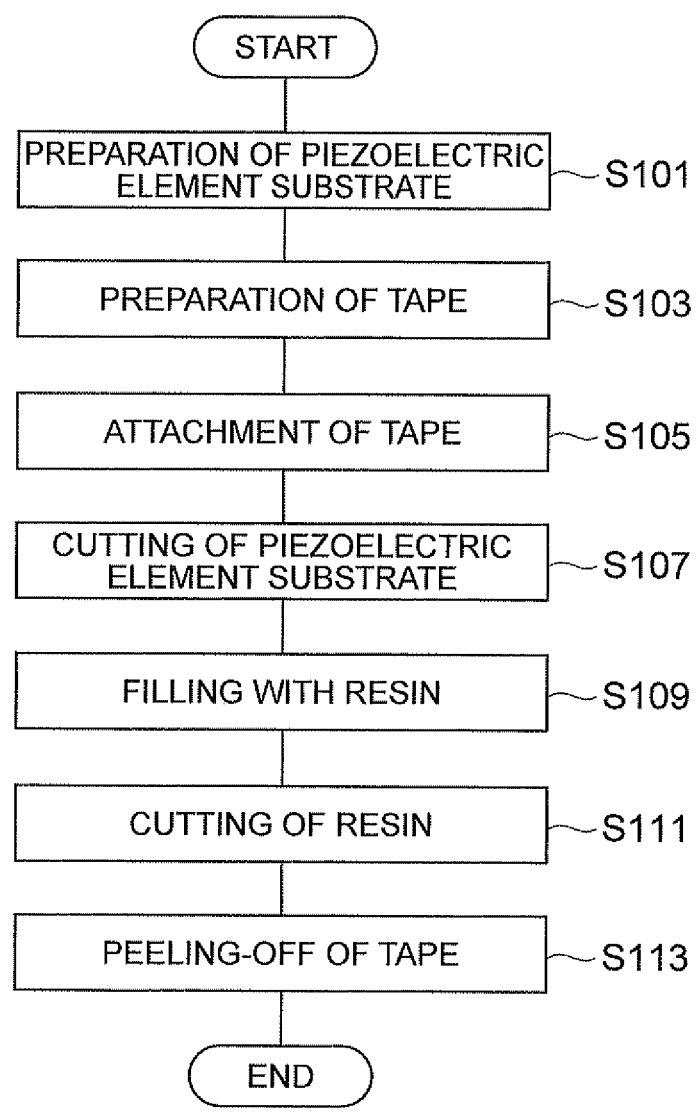
FIG. 3 is a flowchart showing a method for manufacturing the piezoelectric element according to the embodiment.
Figure 4:
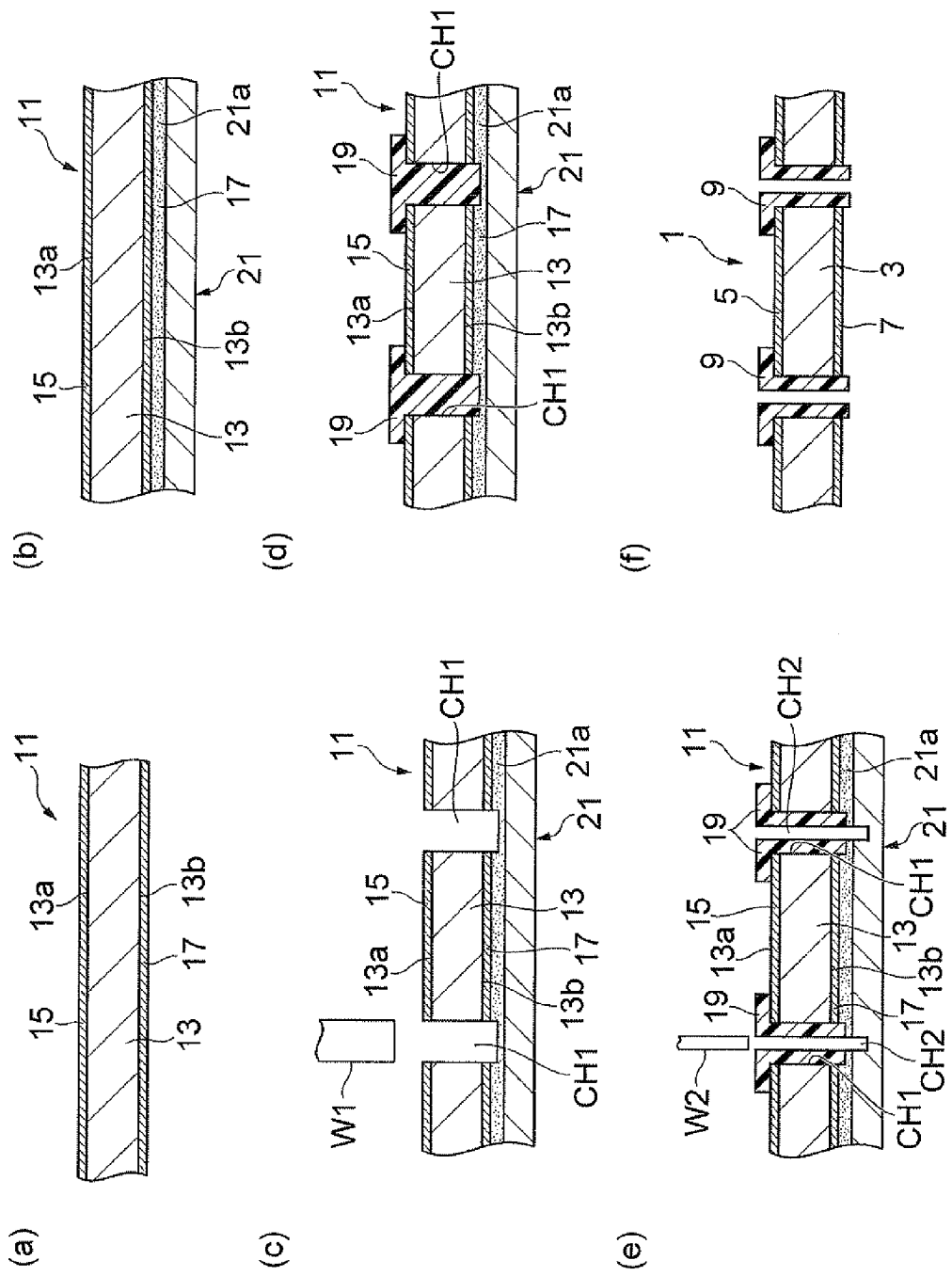
FIG. 4 is schematic views for explaining the manufacturing method of the piezoelectric element according to the embodiment.

Next, a manufacturing method of the piezoelectric element 1 according to the present embodiment will be described with reference to FIGS. 3 and 4. FIG. 3 is a flowchart showing the manufacturing method of the piezoelectric element according to the present embodiment. In FIG. 4, (a) to (f) are schematic views for explaining the manufacturing method of the piezoelectric element according to the present embodiment.

First, a piezoelectric element substrate 11 is prepared (S101). The piezoelectric element substrate 11 is provided with a substrate portion 13 comprised of a piezoelectric ceramic material, a first electrode 15, and a second electrode 17 (cf. (a) in FIG. 4). Specifically, the piezoelectric element substrate 11 has a platelike shape, in a state in which a plurality of piezoelectric elements 1 (except without the resin 9) in an individually-separated state are connected.

The substrate portion 13 has a pair of first principal face 13a and second principal face 13b opposed to each other. The first electrode 15 is formed on the first principal face 13a and the second electrode 17 is formed on the second principal face 13b. When the piezoelectric element substrate 11 is separated into individual piezoelectric elements, the first electrode 15 turns to the first electrodes 5 and the second electrode 17 to the second electrodes 7. The first electrode 15 and second electrode 17 are comprised of a metal material such as Au and are formed, for example, by sputtering or evaporation.

The next process is to prepare a tape 21 consisting of an ultraviolet-curable dicing tape (S103). The tape 21 includes an ultraviolet-curable adhesive layer 21a on its surface and has an adhesive property.

The next process is to attach the tape 21 to the second electrode 17 of the piezoelectric element substrate 11 (S105). In this process, the second electrode 17 is attached to the adhesive layer 21a of the tape 21 (cf. (b) in FIG. 4).

The next process is to cut the piezoelectric element substrate 11 (S107). In this process, the piezoelectric element substrate 11 is diced from the first electrode 15 side with a blade W1 to form channels CH1 in the piezoelectric element substrate 11 (cf. (c) in FIG. 4). When the piezoelectric element substrate 11 is cut, the tape 21 is half cut so that a portion of the tape 21 is removed from the adhesive layer 21a side. The thickness of the blade W1 (i.e., the width of the channels CH1) is set, for example, in the range of about 20 to 1000 µm. There are no particular restrictions on the depth of the half cut of the tape 21, but the depth is preferably determined so as to leave a portion of the adhesive layer 21a in portions of the channels CH1. The depth of the half cut of tape 21 is set, for example, in the range of about 1 to 50 µm.

Cut faces of the substrate portion 13 become the aforementioned end faces 3c. Cut faces of the first electrode 15 become end faces of the first electrodes 5, and cut faces of the second electrode 17 become end faces of the second electrodes 7. Since the first electrode 15 and second electrode 17 are also cut together with the substrate portion 13, the positions of the cut faces of the respective electrodes 15, 17 (the end faces of the respective electrodes 5, 7) are aligned with the positions of the cut faces of the substrate portion 13 (end faces 3c).

Next, the channels CH1 are filled with a resin 19 (S109). A filling method with the resin 19 employed herein can be, for example, printing, dipping, application by a dispenser, or spin coating. The channels CH1 are entirely filled with the resin 19, whereby the resin covers the cut faces of the respective electrodes 15, 17 and the cut faces of the substrate portion 13. Thereafter, the resin 19 is cured (cf. (d) in FIG. 4).

The resin 19 filled in the channels CH1 is in contact with the tape 21. This causes the resin 19 to be so filled as to project outward in the opposed direction of the first principal face 13a and the second principal face 13b from the second electrode 17, and the resin 19 is cured in the projecting state. Furthermore, the resin 19 is so filled as to cover regions near the cut faces in the surface of the first electrode 15, along edges of the first electrode 15. This causes the resin 19 to be so filled as to project outward in the opposed direction from the first electrode 15, and the resin 19 is cured in the projecting state.

Next, the resin 19 is cut from the first electrode 15 side (S111). In this process, the resin 19 is diced from the first electrode 15 side with a blade W2 to form channels CH2 (cf. (e) in FIG. 4). This process results in cutting the resin 19 and the piezoelectric element substrate 11 is separated into individual piezoelectric elements in a state in which the cut faces of the respective electrodes 15, 17 and the cut faces of the substrate portion 13 are covered by the resin 19.

The tape 21 is also half cut. The thickness of the blade W2 (i.e., the width of the channels CH2) is smaller than that of the blade W1 and is set, for example, in the range of about 10 to 400 µm. By this setting, the thickness of the resin 19 covering the cut faces comes to fall in the range of about 5 to 450 µm.

Next, the tape 21 is peeled off from the piezoelectric element substrate 11 (S113). In this process, the tape is irradiated with ultraviolet light to decrease the adhesion of the adhesive layer 21a and then the tape 21 is peeled off from the piezoelectric element substrate 11. This process results in obtaining individually-separated piezoelectric elements 1 (cf. (f) in FIG. 4). Namely, the substrate portion 13 turns to the element bodies 3, the electrodes 15, 17 turn to the electrodes 5, 7, respectively, and the resin 19 turns to the resin 9. The irradiation with ultraviolet light may be carried out after the substrate cutting process S107. In this case, the processes after the substrate cutting process S107 are carried out in a state in which the adhesion of the adhesive layer 21a is lowered.

In the piezoelectric element 1 of the present embodiment, as described above, the entire area of the end faces 3c of the element body 3 is covered by the resin 9. For this reason, crystal grains are prevented from dropping off from the end faces 3c of the element body 3. In the piezoelectric element 1, the first electrode 5 and the second electrode 7 are in contact with the resin 9. For this reason, the first electrode 5 and the second electrode 7 are prevented from delaminating from the element body 3.

Figure 5:
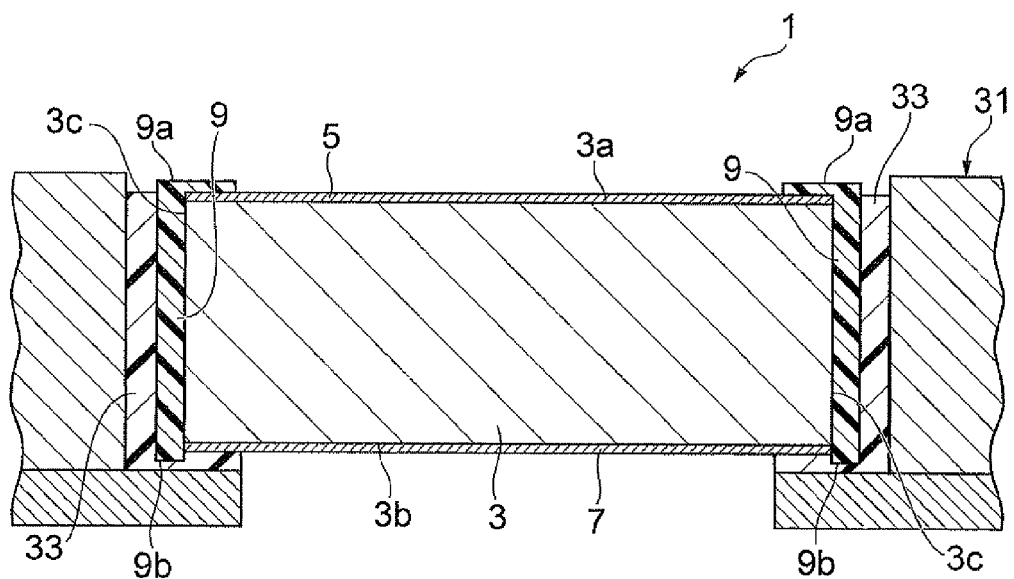
FIG. 5 is a drawing showing an example in which the piezoelectric element of the embodiment is fixed to another member.

In the piezoelectric element 1, the two edges 9a, 9b of the resin 9 covering the entire area of the end faces 3c of the element body 3 are arrange to project outward in the opposed direction from the respective electrodes 5, 7. For this reason, when the piezoelectric element 1 is fixed to another member (e.g., a head suspension) 31 with an adhesive 33 as shown in FIG. 5, the piezoelectric element 1 is arranged so that either one of the principal faces 3a, 3b (electrodes 5, 7) is located on the other member 31 side. In FIG. 5, the piezoelectric element 1 is arranged so that the second principal face 3b (second electrode 7) is located on the other member 31 side. At this time, since the edge 9b of the resin 9 is arranged to project as described above, there is a relatively large gap formed between the surface of the second electrode 7 and the other member 31. This gap can be used as an adhesive pool, so as to enhance the adhesion strength between the piezoelectric element 1 and the other member 31.

When the other member 31 consists of an electrically conductive member, it is necessary to ensure electrical insulation between the electrodes 5, 7 of the piezoelectric element 1 and the other member 31. For this reason, conventionally, the adhesive 33 used is one containing a filler. The filler functions to adjust the distance between the electrode 5 or 7 on the other member 31 side and the other member 31.

In use of the filler-containing adhesive, however, there is variation in size of the filler and therefore it was difficult heretofore to adjust the distance between the electrode 5 or 7 on the other member 31 side and the other member 31 to an appropriate value and difficult to ensure electrical insulation. The filler-containing adhesive is more expensive than adhesives containing no filler. In contrast to it, the present embodiment employs the configuration wherein the edges 9a, 9b of the resin 9 are arranged to project as described above, the distance between the surface of the electrode 5, 7 and the other member 31 is appropriately and readily adjusted. Accordingly, the electrical insulation between the piezoelectric element 1 and the other member 31 is suitably and inexpensively ensured.

In the piezoelectric element 1, the edge 9a of the resin 9 covers the region near the end faces 3c in the surface of the first electrode 5, along the edge of the first electrode 5. This configuration increases the contact area between the first electrode 5 and the resin 9, whereby the first electrode 5 is prevented more securely from delaminating from the element body 3.

The end faces 3c of the element body 3 and the corresponding end faces of the respective electrodes 5, 7 are aligned in position as cut faces. This facilitates contact between each electrode 5, 7 and the resin 9.

Figure 6:
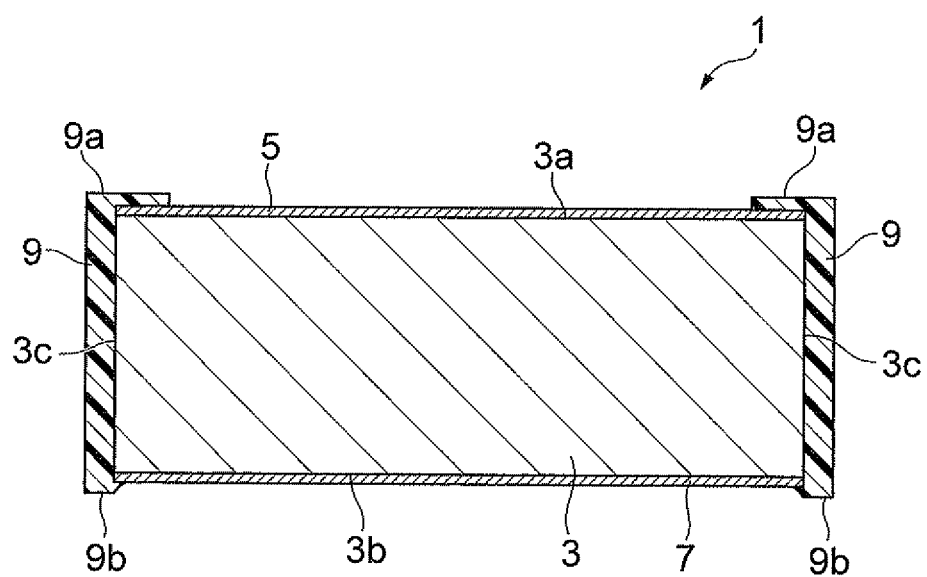
FIG. 6 is a drawing explaining a cross-sectional configuration of a piezoelectric element according to a modification example of the embodiment.

Next, a configuration of the piezoelectric element 1 according to a modification example of the embodiment will be described with reference to FIG. 6. FIG. 6 is a drawing explaining a cross-sectional configuration of the piezoelectric element according to the modification example of the embodiment.

In the piezoelectric element 1 of the modification example, the edge 9b of the resin 9 covers a region near the end faces 3c in the surface of the second electrode 7, along the edge of the second electrode 7.

Figure 7:
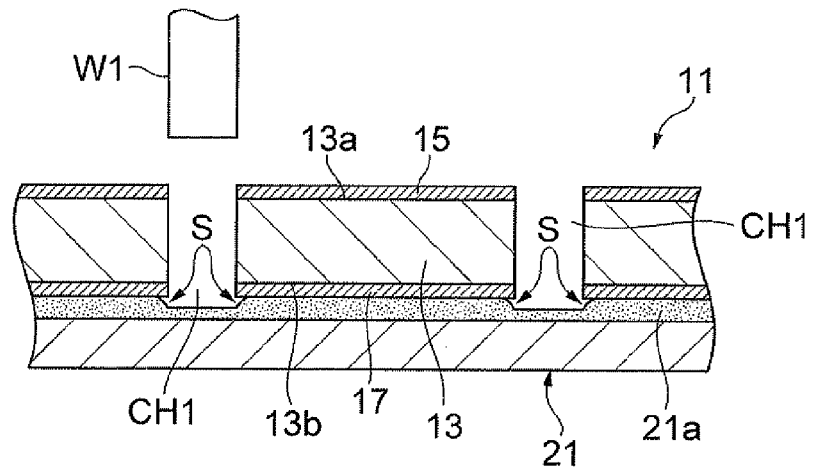
FIG. 7 is schematic views for explaining a method for manufacturing the piezoelectric element according to the modification example of the embodiment.
Figure 7:
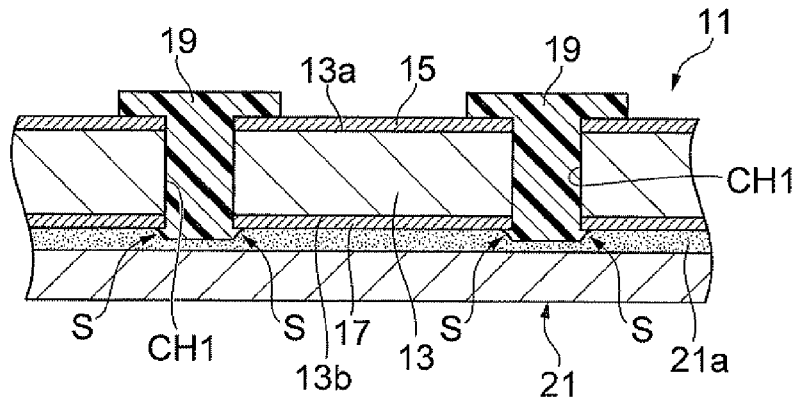
Figure 7:
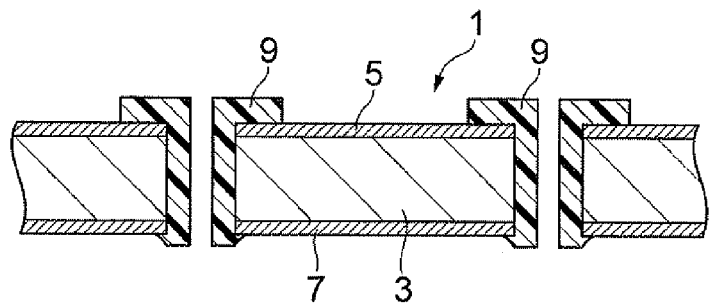

Next, a manufacturing method of the piezoelectric element 1 according to the modification example will be described with reference to FIG. 7. In FIG. 7, (a) to (c) are schematic views for explaining the manufacturing method of the piezoelectric element according to the modification example of the embodiment.

The piezoelectric element 1 of the modification example is also manufactured through the processes S101-S113 in the manufacturing method shown in FIG. 3, but it is different from the above embodiment in that the edge 9b of the resin 9 is formed as described below.

The piezoelectric element substrate 11 is cut to remove a portion of the adhesive layer 21a (S107). At this time, as shown in (a) in FIG. 7, a portion of the adhesive layer 21a adjacent to the blade W1 (portion attached to the region near the cut faces in the second electrode 17) is deformed with progress of the blade W1. This process results in forming a space S between the region near the cut faces in the surface of the second electrode 17 and the tape 21.

Next, the channels CH1 are filled with the resin 19 (S109). At this time, as shown in (b) in FIG. 7, the channels all are filled with the resin 19 so that the resin 19 comes into contact with the tape 21. Therefore, the space S is also filled with the resin 19 and the resin 19 is cured in a state in which the space S is filled therewith. This causes the resin 19 to be so filled and cured as to cover the region near the cut faces in the surface of the second electrode 17, along the edge of the second electrode 17.

Thereafter, the resin 19 is cut from the first electrode 15 side (S111) and the tape 21 is peeled off from the piezoelectric element substrate 11 (S113), thereby obtaining individually-separated piezoelectric elements 1, as shown in (c) in FIG. 7.

In the present modification example, as described above, crystal grains are prevented from dropping off from the end faces 3c of the element body 3 and the first electrode 5 and the second electrode 7 are prevented from delaminating from the element body 3. The present modification example also improves in adhesion strength between the piezoelectric element 1 and the other member 31.

Furthermore, in the present modification example, the edge 9b of the resin 9 covers the region near the end faces 3c in the surface of the second electrode 7, along the edge of the second electrode 7. This configuration increases the contact area between the second electrode 7 and the resin 9, whereby the second electrode 7 is prevented more securely from delaminating from the element body 3.

The above described the preferred embodiments of the present invention, but it should be noted that the present invention is by no means intended to be limited to the above embodiments and can be modified in many ways without departing from the scope and spirit of the invention.

For example, the planar shape of the piezoelectric element 1 (element body 3) does not have to be limited to the rectangular shape shown in FIG. 1, but it can be arbitrarily modified according to places to which the piezoelectric element 1 is applied.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A piezoelectric element comprising:
   an element body which has a pair of principal faces opposed to each other, and four end faces extending in a direction in which the pair of principal faces are opposed to each other, so as to connect the pair of principal faces, the element body is comprised of a piezoelectric ceramic material, the element body has a rectangular parallelepiped shape;
   a pair of electrodes arranged respectively on the pair of principal faces, the respective electrodes each having a rectangular shape in a plan view, the respective electrodes each having four sides; and
   a resin covering an entire area of the four end faces and arranged so as to make contact with each of the four sides of each of the pair of electrodes,
   wherein the resin has two edges in said direction projecting outward in said direction from the respective electrodes.

2. The piezoelectric element according to claim 1,
   wherein at least one of the two edges of the resin covers a region near the end faces in a surface of the electrode, along an edge of the electrode.

3. The piezoelectric element according to claim 1,
   wherein the end faces of the element body and respective end faces of the pair of electrodes are aligned in position as cut faces.

4. A head suspension having a piezoelectric element, the piezoelectric element comprising:
   an element body which has a pair of principal faces opposed to each other, and four end faces extending in a direction in which the pair of principal faces are opposed to each other, so as to connect the pair of principal faces, the element body is comprised of a piezoelectric ceramic material, the element body has a rectangular parallelepiped shape;
   a pair of electrodes arranged respectively on the pair of principal faces, the respective electrodes each having a rectangular shape in a plan view, the respective electrodes each having four sides; and
   a resin covering an entire area of the four end faces and arranged so as to make contact with each of the four sides of each of the pair of electrodes,
   wherein the resin has two edges in said direction projecting outward in said direction from the respective electrodes, and
   wherein the piezoelectric element is fixed to the head suspension with an adhesive.

5. The piezoelectric element according to claim 4,
   wherein at least one of the two edges of the resin covers a region near the end face in a surface of the electrode, along an edge of the electrode.

6. The piezoelectric element according to claim 4,
   wherein the end faces of the element body and respective end faces of the pair of electrodes are aligned in position as cut faces.

* * * * *